(12) United States Patent
Daniels

(10) Patent No.: US 10,886,696 B2
(45) Date of Patent: Jan. 5, 2021

(54) MIXED AND DISTRIBUTED LASER ILLUMINATION SYSTEM

(71) Applicant: Derek Daniels, Orlando, FL (US)

(72) Inventor: Derek Daniels, Orlando, FL (US)

( * ) Notice: Subject to any disclaimer, the term of this patent is extended or adjusted under 35 U.S.C. 154(b) by 0 days.

(21) Appl. No.: 16/537,274

(22) Filed: Aug. 9, 2019

(65) Prior Publication Data

US 2020/0052459 A1 Feb. 13, 2020

Related U.S. Application Data

(60) Provisional application No. 62/717,087, filed on Aug. 10, 2018.

(51) Int. Cl.
*F21V 8/00* (2006.01)
*H01S 5/026* (2006.01)
*G02B 6/12* (2006.01)

(52) U.S. Cl.
CPC ........ *H01S 5/0261* (2013.01); *G02B 6/12019* (2013.01); *H01S 5/0265* (2013.01); *F21V 2200/10* (2015.01); *F21V 2200/13* (2015.01); *G02B 2006/1215* (2013.01)

(58) Field of Classification Search
CPC ............ F21V 2200/00–40; G02B 6/04; G02B 6/0005; G02B 6/0008
USPC .......................................... 362/553–554, 556
See application file for complete search history.

(56) References Cited

U.S. PATENT DOCUMENTS

2007/0139951 A1\* 6/2007 Dick ...................... G02B 6/001
362/554
2011/0013414 A1\* 1/2011 Smithson ............. G02B 6/0006
362/554

\* cited by examiner

*Primary Examiner* — Sean P Gramling
(74) *Attorney, Agent, or Firm* — Jason T. Daniel Esq.; Daniel Law Offices, P.A.

(57) ABSTRACT

A mixed and distributed laser illumination system includes a source unit having an internally located power supply, a laser driver and a light generator. The light generator includes a plurality of laser diodes that are communicatively linked with the laser driver. The output of each laser diode is coupled to an individual cable that terminates at a fiber combiner. A transmission cable is in communication with the fiber combiner and transmits the light from the source unit to a fiber splitter. The fiber optic splitter distributes the received light to a plurality of output cables each having an optical diffuser or a conversion element for converting infrared to ultraviolet light.

10 Claims, 4 Drawing Sheets

MIXED AND DISTRIBUTED LASER ILLUMINATION SYSTEM

CROSS-REFERENCE TO RELATED APPLICATIONS

This application claims the benefit of U.S. Application Ser. No. 62/717,087 filed on Aug. 10, 2018, the contents of which are incorporated herein by reference.

TECHNICAL FIELD

The present invention relates generally to lighting systems, and more particularly to a mixed and distributed laser system for providing illumination to a room or other specified area.

BACKGROUND

The statements in this section merely provide background information related to the present disclosure and may not constitute prior art.

Traditionally, residential and commercial building lighting is accomplished via a plurality of individual light emitting devices such as incandescent, LED or fluorescent bulbs, for example, that are positioned throughout the structure and work independently to illuminate the area in which they are located. In this regard, each of the lights function independently and may provide different levels of illumination.

Although this arrangement has been the norm for many years, there are several practical limitations and drawbacks associated with this setup. For example, owing to the plurality of different individual lights, it is not possible for a user to easily change the output/spectrum of the entire lighting system at will. Moreover, when installing such systems during the new construction of a building, there are tremendous costs associated with the design and distribution of electrical power to operate each lighting fixture. Finally, as the individual lighting elements ultimately fail, users must be able to physically access the lighting fixtures to replace the spent bulb(s), thus causing an ongoing cycle of maintenance and replacement costs.

Accordingly, it would be beneficial to provide a mixed and distributed illumination system for providing different wavelengths of illumination throughout a structure from a single source which can be distantly located, thus eliminating the drawbacks described above.

SUMMARY OF THE INVENTION

The present invention is directed to a mixed and distributed laser illumination system. One embodiment of the present invention can include a source unit having an internally located power supply, laser drivers and a light generator. The light generator can include a plurality of laser diodes that are communicatively linked with the laser drivers. The output of each laser diode can be coupled to an individual cable that terminates at a fiber combiner. A transmission cable can be in communication with the fiber combiner and can transmit the light from the source unit to a fiber splitter.

In one embodiment, the fiber splitter can receive the light generated by the source unit and can distribute the received light to a plurality of output cables. Each of the output cables can include a distal end having either an optical diffuser for visible illumination or a conversion element for converting infrared to ultraviolet light.

This summary is provided merely to introduce certain concepts and not to identify key or essential features of the claimed subject matter.

BRIEF DESCRIPTION OF THE DRAWINGS

Presently preferred embodiments are shown in the drawings. It should be appreciated, however, that the invention is not limited to the precise arrangements and instrumentalities shown.

DETAILED DESCRIPTION OF THE INVENTION

Figure 1:
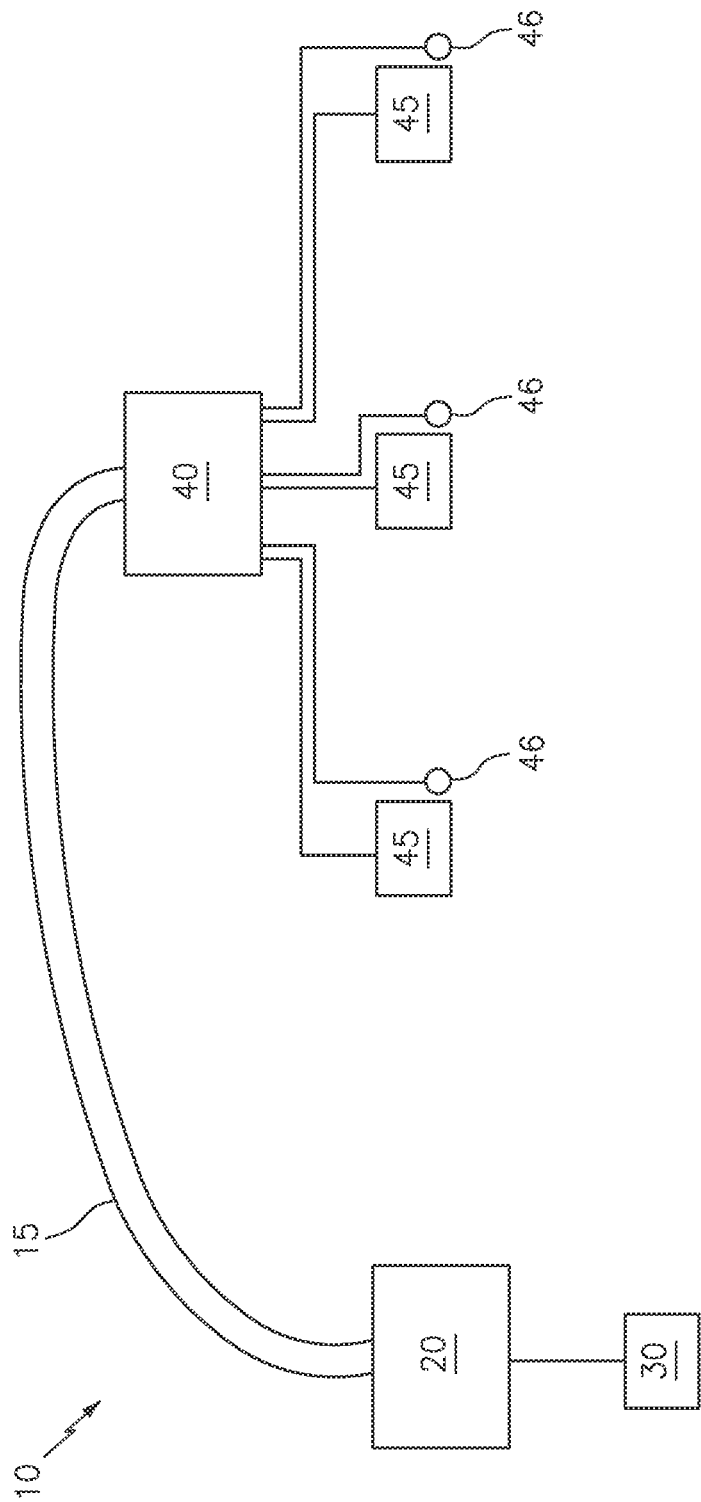
FIG. 1 is a perspective view of the mixed and distributed laser illumination system that is useful for understanding the inventive concepts disclosed herein.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

Although described as a system to augment or replace traditional lighting systems in a structure, this is for illustrative purposes only. To this end, the inventive concepts can be applied to any location and/or device that produces lighting such as streetlights, vehicles and performance venues, for example.

FIGS. 1-4 illustrate one embodiment of a mixed and distributed laser illumination system 10 that are useful for understanding the inventive concepts disclosed herein. In each of the drawings, identical reference numerals are used for like elements of the invention or elements of like function. For the sake of clarity, only those reference numerals are shown in the individual figures which are necessary for the description of the respective figure. For purposes of this description, the terms "upper," "bottom," "right," "left," "front," "vertical," "horizontal," and derivatives thereof shall relate to the invention as oriented in FIG. 1.

As shown in FIG. 1, the mixed and distributed laser illumination system 10 can include a transmission cable 15, a source unit 20, a controller 30, a fiber splitter 40 and plurality of light outputs 46/47.

Figure 2:
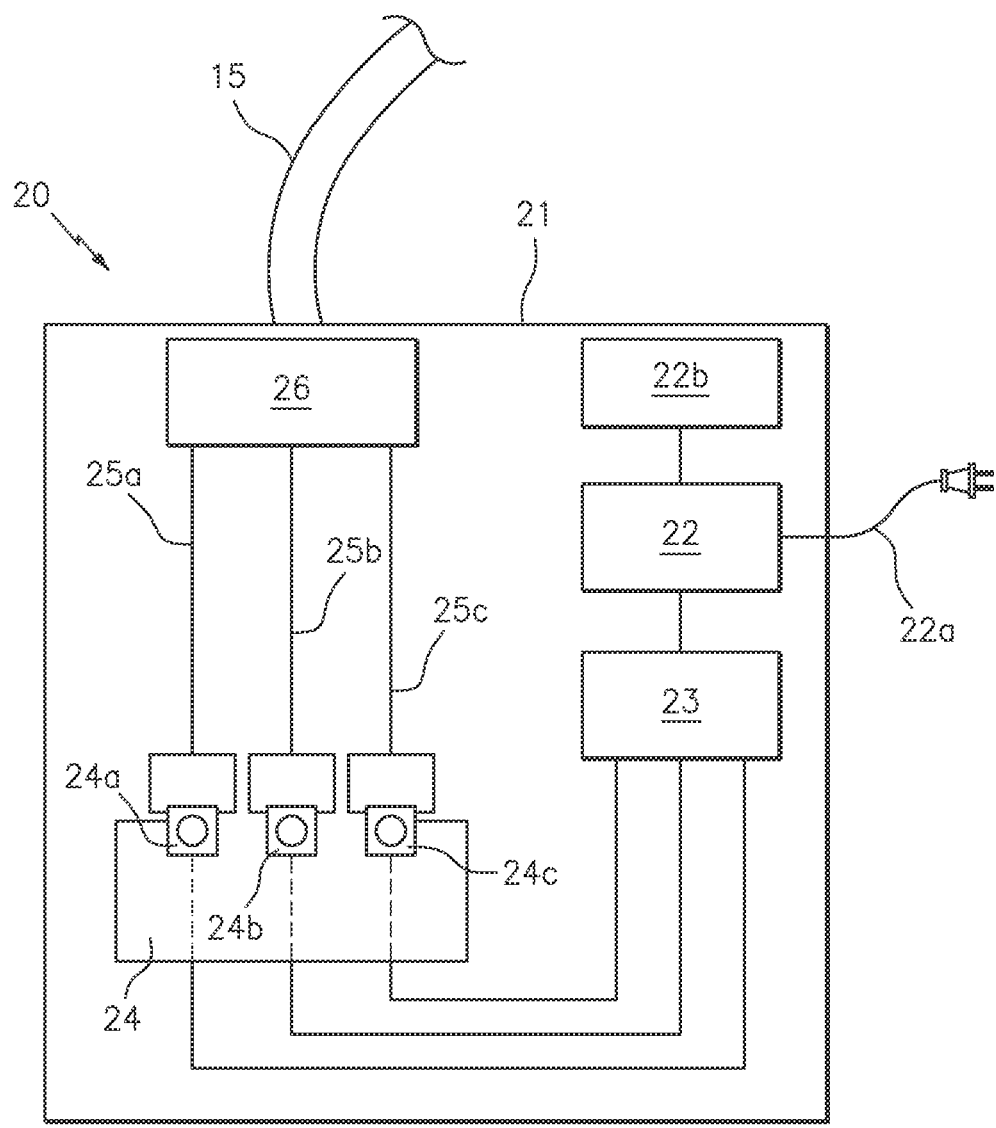
FIG. 2 is a side view of the source unit device in accordance with one embodiment of the invention.

FIG. 2 illustrates one embodiment of the source unit 20 which can function to generate visible and/or non-visible light for distribution to the below described splitter 30. Although illustrated as separate elements, those of skill in the art will recognize that one or more components of the source unit 20 may comprise or include one any number of different elements that function together to perform the noted functionality.

The main body 21 can include any number of different shapes and sizes and can be constructed from any number of different materials suitable for encompassing each of the noted components. In one preferred embodiment, the main body 21 can be constructed from lightweight injection molded plastic having a plurality of internal connectors (not shown) for securely housing each of the device elements. Of course, any number of other known construction materials such as PVC and composites, for example, are also contemplated.

In one embodiment, the power supply 22 can include a common A/C electrical power transformer and cord 22a capable of allowing the unit 20 to receive electricity from a standard electrical outlet. Additionally, one or more batteries 22b can be provided so as to power the system in the event that commercial power is unavailable. As will be described below, owing to the extremely low power consumption of the system, it is possible to operate for extended periods of time on battery power without interruption.

The laser driver 23 can be positioned between the output of the power supply 22 and the below described light generator 24. The laser driver can function to control/drive the operation of each of the plurality of laser diodes within the light generator by selectively providing a current instead of a voltage to each laser diode.

Laser drivers are extremely well known in the art. One example of a suitable laser driver for use herein includes the model HPLDDD-60A-24V Laser diode driver that is commercially available from Opt Lasers, for example. Of course, any number of other such devices may also be utilized.

The light generator 24 can include at least one red laser diode 24a, at least one green laser diode 24b and at least one blue laser diode 24c. Each of the laser diodes can be embedded within a heat sync or other heat dissipating device, and can be communicatively linked to the laser driver 23. In the preferred embodiment, each of the laser diodes can include comprise or consist of 2-7 Watt diodes that produce several hundred lumens of light per Watt.

Of course, the generator is not limited to the use of any particular number, type, or color laser diode as any number of other laser diodes and/or light producing devices are also contemplated. To this end, the system is designed to be scalable so as to be used anywhere.

In one embodiment, a plurality of fiber optic cables 25a, 25b and 25c can be in communication with the laser diodes 24a, 24b and 24c, respectively along a first end, and can be in communication with a fiber combiner 26 along a second end.

In one embodiment, one or more of fiber optic cables 25a-25c can be doped to allow optical amplification of the input optical pump energy provided by one or more laser diodes 24a-24c. The use of this fiber-laser light amplification example allows higher-power light production for a plurality of uses (e.g., illumination and sanitation).

As described herein, the fiber combiner 26 can include any number of different components such as one or more individual fiber optic cable splices, for example, that are capable of joining each of the individual cables 25a-25c to a single transmission cable 15 in order to allow the light produced by the light generator to be delivered to the below described splitter 40.

Unlike traditional fiber optic systems which use a single mode fiber cable, it is preferred that each of the individual cables 25a-25c and the transmission fiber cable 15 be constructed from multi-mode fiber optic cable. The use of multi-mode cable allowing multiple wavelengths (e.g., modes) of light to be carried from the light generator 24 to the filter splitter 30 and beyond. As a result, the system 10 is advantageously able to produce and distribute both visual lighting at many different intensities and color ranges, along with special lighting such as infrared and/or ultraviolet, for example.

Because the system is designed to distribute light from the source unit 20 to a fiber splitter 40 located distant from the unit, the cable 15 can include any number of different lengths and sizes. The cable can also include shielding and bend reinforcement so as to allow the cable to be routed through walls and ceiling components of a building or other structure where the lighting system is to be deployed.

Figure 3:
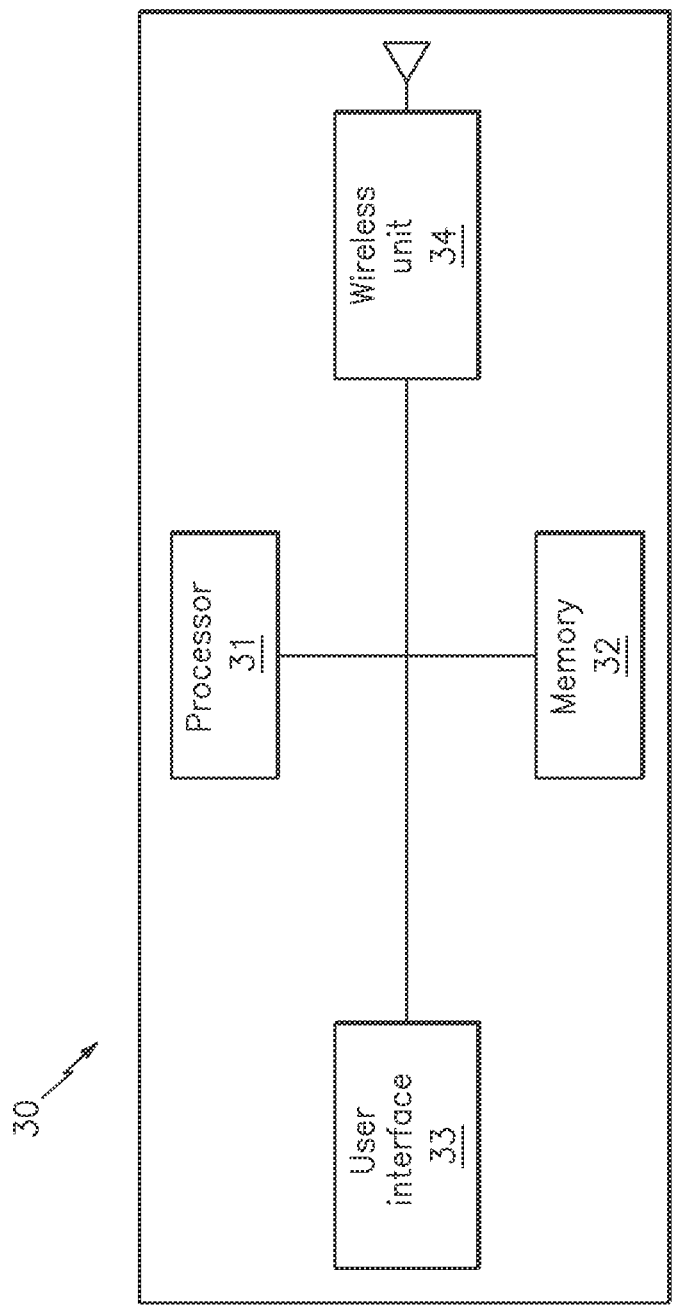
FIG. 3 is a simplified block diagram of the controller of the mixed and distributed laser illumination system, in accordance with one embodiment of the invention.

FIG. 3 illustrates one exemplary embodiment of a system controller 30 that includes a processor 31 that is conventionally connected to an internal memory 32, a user interface 33, and a communication unit 34.

The processor 31 can include, comprise or consist of a conventional central processing unit (CPU) or any other type of device, or multiple devices, capable of manipulating or processing information such as program code stored in the memory 32 in order to allow the system to perform the functionality described herein.

Memory 32 can act to store operating instructions in the form of program code for the processor 31 to execute. Although illustrated in FIG. 3 as a single component, memory 32 can include one or more physical memory devices such as, for example, local memory and/or one or more bulk storage devices. As used herein, local memory can refer to random access memory or other non-persistent memory device(s) generally used during actual execution of program code, whereas a bulk storage device can be implemented as a persistent data storage device such as a hard drive, for example, containing programs that permit the processor to perform the functionality described below.

In this regard, various embodiments of the system can include functionality for allowing the memory to store user-defined configurations such as particular lighting schemes and the like for execution by the source unit.

The user interface 33 can function to accept user inputs and/or to provide operating information to a device user. In various embodiments, the user interface can include or control one or more buttons/switches that are connected to the processor so as to activate various programmatic functions. In addition to above, user interface can include or control any number of visual displays such as a touch screen Graphic User Interface (GUI), for example, that is capable of performing two-way communication with a device user.

The communication unit 34 can include any number of components capable of sending and/or receiving electronic signals with an externally located device, either directly or over a network. In one preferred embodiment, the communication unit can include a Bluetooth or WIFI transceiver for communicating wirelessly with an external device such as a smartphone, computer and/or tablet device running an App. Such a feature advantageously allowing a user to remotely control the lighting within a particular area. Of course, any number of other known transmission and reception mechanisms and protocols can also be utilized herein.

Figure 4:
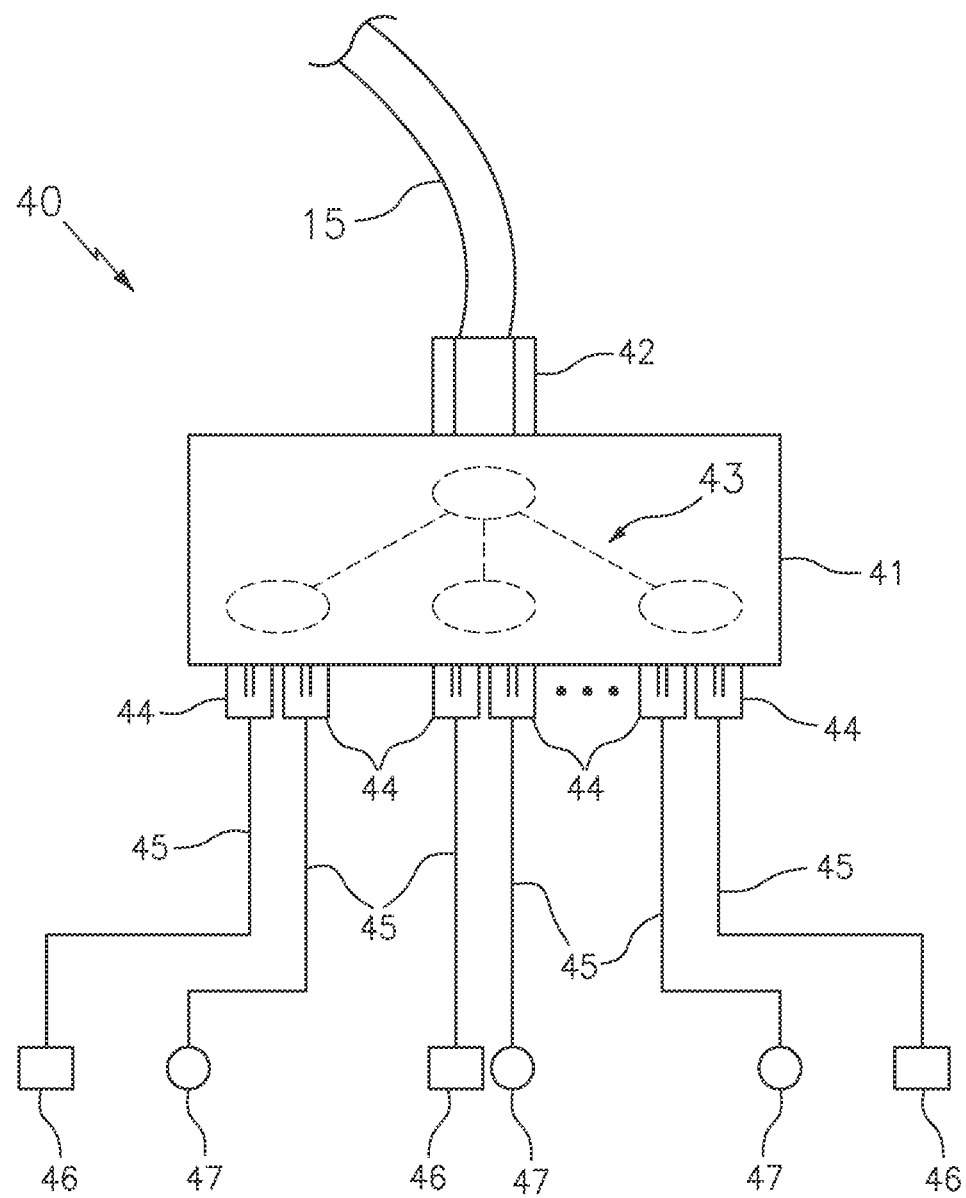
FIG. 4 is a partial cutout view of the fiber splitter and plurality of light output portions of the mixed and distributed laser illumination system.

As shown in FIG. 4, the fiber optic splitter 40 can include a main body 41 having an input coupler 42 for engaging the transmission fiber 15. A plurality of free space optic lenses 43 can be positioned within the main body for receiving the light from the fiber 15 and distributing the same to a plurality of output couplers 44 along the main body. In various embodiments, the splitter can be configured to split and distribute the received light equally or unequally among the plurality of output couplers, depending on the intended use and distribution of the overall lighting system.

In either instance, each of the plurality of output couplers 44 can be engaged by an output cable 45 that also comprises a multi-mode fiber optic core. Each of the output cables can function to transport the generated light to a final destination such as a particular room or other such location.

In one embodiment, one or more of the output cables 45 can include an optical diffuser 46 along the distal end. Each of the optical diffusers 46 can be constructed from any number of different materials such as frosted glass, for example and can function to cause the light emanating from the respective cable to broaden, thus minimizing high intensity bright spots and providing gentle visual illumination to a room or other area where the output cable 45 and diffuser are located.

In one embodiment, one or more of the output cables 45 can include a conversion element 47 such as a non-linear crystal, for example, along the distal end. As noted above, because the system 10 uses multi-mode fiber optic cables, Infrared light produced by the source unit 20 can be transmitted to each of the output cables 45 and can be converted into ultraviolet light via the conversion element(s) 47. As is known to those of skill in the art, ultraviolet light is an effective disinfectant for killing or inactivating a host of microorganisms, and is often used in laboratory, hospital and clean room settings.

Accordingly, the above described system provides a mixed and distributed laser illumination system which can generate and supply lighting in a variety of different colors and intensities to any number of desirable locations.

As to a further description of the manner and use of the present invention, the same should be apparent from the above description. Accordingly, no further discussion relating to the manner of usage and operation will be provided.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Likewise, the terms "consisting" shall be used to describe only those components identified. In each instance where a device comprises certain elements, it will inherently consist of each of those identified elements as well.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A mixed and distributed laser illumination system, comprising:
   a source unit having an internal power supply and a light generator, wherein the light generator comprises a plurality of laser diodes;
   a controller that is communicatively linked to the source unit;
   a single transmission fiber cable having a first end and a second end;
   a plurality of fiber optic cables, wherein each of the plurality of fiber optic cables is having a first end that is in communication with one of the plurality of laser diodes;
   a fiber combiner that is in communication with a second end of each of the plurality of fiber optic cables and in communication with the first end of the single transmission fiber cable;
   a fiber optic splitter that is in communication with the second end of the single transmission fiber cable; and
   a plurality of output fiber optic cables that are in communication with the fiber optic splitter.

2. The system of claim 1, further comprising:
   a laser driver that is positioned between each of the plurality of laser diodes and the internal power supply.

3. The system of claim 1, wherein the fiber optic splitter includes functionality for splitting and distributing a light supplied by the single transmission fiber cable to the plurality of output cables.

4. The system of claim 3, further comprising:
   at least one optical diffuser that is in communication with at least one of the plurality of output cables.

5. The system of claim 1, wherein the controller comprises:
   a user interface device for receiving a user input.

6. The system of claim 5, wherein the controller comprises:
   a wireless communication unit that is configured to communicate with an externally located electronic device.

7. The system of claim 1, wherein the fiber combiner comprises a plurality of fiber optic cable splices capable of joining the plurality of the fiber optic cables in to the first end of the single transmission fiber cable and to allow a light from the plurality of laser diodes to be delivered to the fiber optic splitter through the single transmission fiber cable.

8. The system of claim 1, wherein the fiber optic splitter comprises a plurality of free space optic lenses for receiving a light from the single transmission fiber cable and distributing the light to the plurality of output fiber optic cables.

9. The system of claim 8, wherein the fiber optic splitter splits and distributes the light unequally among the plurality of output fiber optic cables.

10. The system of claim 8, wherein the fiber optic splitter splits and distributes the light equally among the plurality of output fiber optic cables.

\* \* \* \* \*